(12) United States Patent
Sanchez

(10) Patent No.: US 10,924,093 B1
(45) Date of Patent: Feb. 16, 2021

(54) INTEGRATED CIRCUIT WITH FINFETS HAVING DUMMY STRUCTURES

(71) Applicant: NXP USA, Inc., Austin, TX (US)

(72) Inventor: Hector Sanchez, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/670,755

(22) Filed: Oct. 31, 2019

(51) Int. Cl.
| | |
|---|---|
| *H01L 29/78* | (2006.01) |
| *H03K 5/003* | (2006.01) |
| *H01L 29/417* | (2006.01) |
| *H01L 27/088* | (2006.01) |
| *H01L 29/10* | (2006.01) |
| *H01L 27/02* | (2006.01) |
| *H01L 29/08* | (2006.01) |

(52) U.S. Cl.
CPC ......... *H03K 5/003* (2013.01); *H01L 27/0207* (2013.01); *H01L 27/0886* (2013.01); *H01L 29/0847* (2013.01); *H01L 29/1087* (2013.01); *H01L 29/41791* (2013.01); *H01L 29/7851* (2013.01)

(58) Field of Classification Search
CPC ....... H03K 19/0175; H03K 19/017518; H03K 19/0185; H03K 19/018507; H03K 19/018514; H03K 19/018521; H03K 19/018528; H03K 19/018557–018578
See application file for complete search history.

(56) References Cited

U.S. PATENT DOCUMENTS

| | | | | |
|---|---|---|---|---|
| 5,378,945 | A  * | 1/1995 | Partovi | H03K 19/00315 |
| | | | | 326/121 |
| 5,731,713 | A  * | 3/1998 | Proebsting | G11C 7/1078 |
| | | | | 326/71 |
| 7,679,139 | B2 * | 3/2010 | Larsen | H01L 29/66795 |
| | | | | 257/347 |
| 8,258,848 | B2 * | 9/2012 | Chen | H03K 3/35613 |
| | | | | 326/68 |
| 8,618,861 | B2 * | 12/2013 | Chen | H03K 19/017509 |
| | | | | 326/68 |
| 8,943,455 | B2 | 1/2015 | Chen et al. | |
| 9,058,462 | B2 | 6/2015 | Tam et al. | |
| 9,356,577 | B2 | 5/2016 | Sanchez et al. | |
| 9,503,090 | B2 | 11/2016 | Fifield | |
| 9,679,887 | B1 * | 6/2017 | Huang | H01L 27/0266 |
| 9,710,006 | B2 * | 7/2017 | Boling | H01L 29/7851 |

(Continued)

OTHER PUBLICATIONS

Ogasahara et al., Supply Noise Suppression by Triple-Well Structure, IEEE Transactions on Very Large Scale (VLSI) Systems, vol. 21, No. 4, Apr. 2013, pp. 781-785.*

*Primary Examiner* — Thomas J. Hiltunen

(57) ABSTRACT

A circuit includes a plurality of voltage supply terminals including a lowest voltage supply terminal, an N-type finFET, and a current path electrically coupled to the lowest voltage supply terminal, where the N-type finFET transistor is located in the current path. The N-type finFET transistor includes at least one semiconductor fin, a gate structure made of a gate material located over the at least one fin, an end structure of the gate material located over an end of the at least one fin, a source electrode, and a drain electrode. The at least one fin is located over a well region, and the end structure is electrically tied to the well region, in which the well region is not electrically tied to the lowest voltage supply terminal.

20 Claims, 5 Drawing Sheets

(56) References Cited

U.S. PATENT DOCUMENTS

| | | | |
|---|---|---|---|
| 10,615,260 B1* | 4/2020 | Voldman | H01L 27/0924 |
| 2010/0127752 A1* | 5/2010 | Fort | H03K 3/356113 |
| | | | 327/333 |
| 2011/0095804 A1* | 4/2011 | Kumar | H03K 19/018521 |
| | | | 327/333 |
| 2018/0233461 A1* | 8/2018 | Okagaki | H01L 23/576 |

* cited by examiner

INTEGRATED CIRCUIT WITH FINFETS HAVING DUMMY STRUCTURES

BACKGROUND

Field

This disclosure relates generally to integrated circuits, and more specifically, to circuits with fin Field Effect Transistors (finFETs) having dummy structures.

Related Art

Within integrated circuits today, it is increasingly common to integrate high voltage devices with low voltage devices, such as in input/output (I/O) buffers. For example, in such applications, a high voltage domain with a corresponding high supply voltage (VDDH) interfaces with a low voltage domain with a corresponding low supply voltage (VDDL) which is lower than the high supply voltage. High voltage devices are those devices which operate using the high supply voltages, while low voltage devices operate using the low supply voltages and generally have a maximum voltage rating less than the high supply voltage. For example, in a four terminal device having a source terminal, drain terminal, gate terminal, and body terminal, the maximum voltage rating corresponds to the maximum voltage drop allowed across any two terminals of the four terminal device. A high voltage violation occurs if a voltage across any of the two terminals exceeds the maximum voltage rating. If the maximum voltage rating is exceeded, permanent damage may result in the low voltage devices, causing circuit failure. The maximum voltage rating for low voltage devices may be exceeded in such circuits due, for example, to uncontrolled leakage currents.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
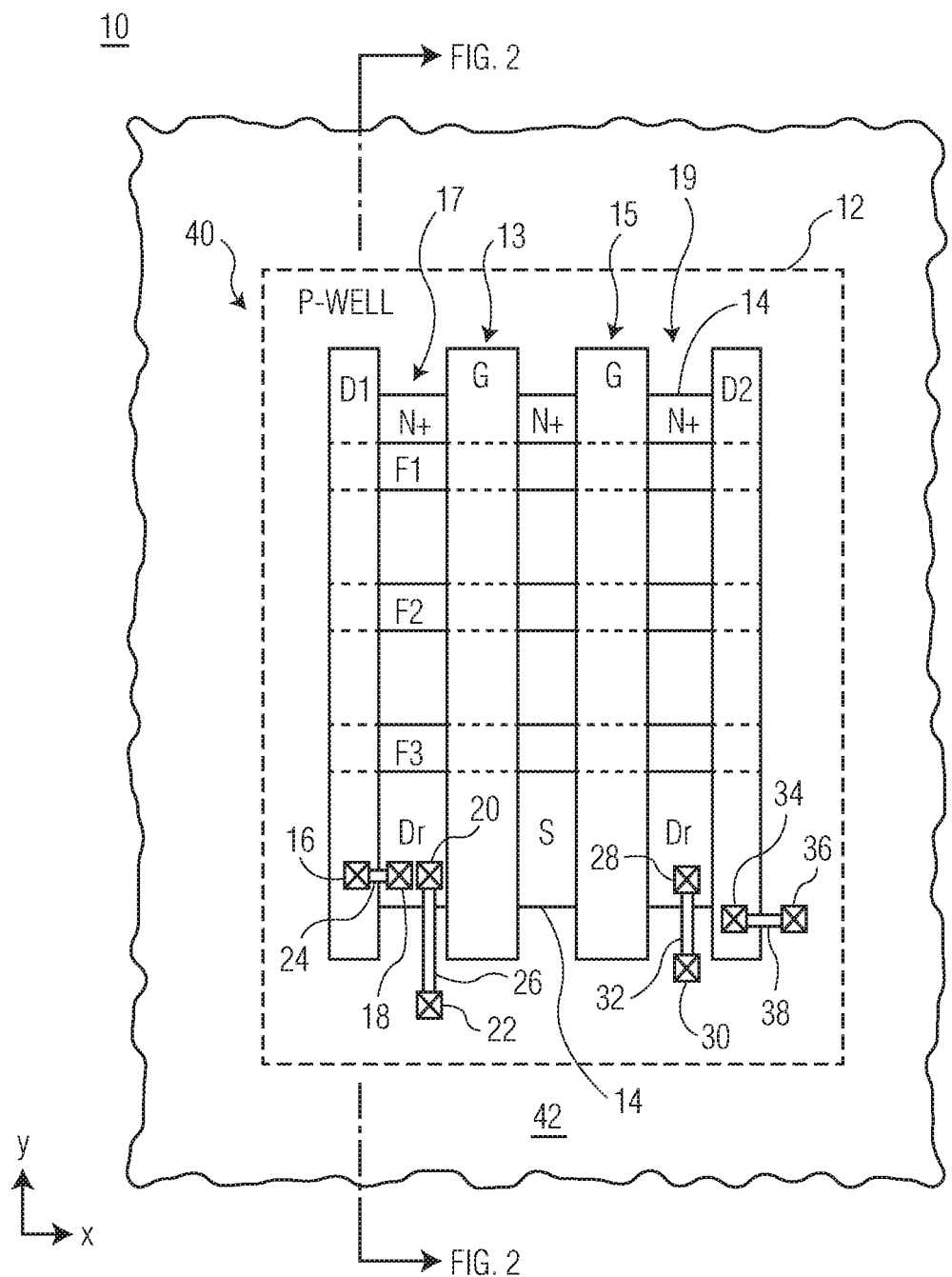
FIG. 1 illustrates a top down view of a finFET transistor layout, in accordance with one embodiment of the present invention.

As discussed above, within circuit applications which interface high and low voltage domains, the low voltage devices should not be exposed to voltages which are greater than a maximum voltage rating of the devices in order to prevent damage to the low voltage devices. Therefore, if there is a low voltage device attached to a circuit node which can experience an unexpectedly high voltage for the node, the low voltage device can be damaged. This may occur, for example, due to leakage currents, especially in a circuit which also utilizes a high supply voltage for its high voltage devices. In one example, the high supply voltage (VDDH) for the high voltage devices of the circuit is 3.3V while the low supply voltage (VDDL) for the low voltage devices may only be 0.8V. In this situation, the low voltage devices may have a maximum voltage rating of about 1.8V, which allows for safe exposure to VDDL, but results in high voltage violations if exposed to a voltage higher than 1.8V. Each of these circuits which interface between a high voltage domain having a VDDH supply terminal and a low voltage domain having a VDDL supply terminal also includes a lowest supply terminal (lower than each of VDDH and VDDL), referred to as a VSS supply terminal, which may refer to, for example, ground. Examples of such circuits which interface high and low voltage domains are level shifters, voltage generators, pass gates, etc. In one embodiment, n-type metal-oxide-semiconductors (MOS) devices in these circuits are implemented as finFET transistors, referred to as n-type finFETs.

An n-type finFET, as will be described in more detail below, includes one or more fins, in which gate conductors are formed in parallel over the fins. Channel regions of the finFET are formed within the fins at the intersections between the gate conductors and the fins. The fins are formed from semiconductor material on a P-well (i.e. a p-type well region), in which the body of the finFET (within and under each fin at the intersection with a gate conductor) is in contact with the P-well. The source/drain regions (i.e. electrodes) of the finFET device are located in the P-well, on either side of the channel regions. When the finFET is on (in its conductive state), current flows in the channel regions of the fins between the source and drains, perpendicular to the gates. During manufacture of such finFET devices, polysilicon structures, parallel to the gate conductors, are formed on the ends of the active region or "OD" area of the transistor. These polysilicon structures are referred to as polysilicon on OD edge (PODE) structures which protect the ends of the fins during processing. As will be described further below, each PODE structure is immediately adjacent (and possibly overlapping) either a source region or a drain region of a finFET device. The PODE structures are dummy structures, in that they do not provide a functional circuit element. That is, they do not functionally operate in the circuit as a transistor. These PODE structures may also be referred to herein as end structures, dummy structures, or PODE elements.

Typically, when the finFET transistor is in an off state (in a non-conductive state), the source electrode, PODE structure, and P-well are floating, while the gate electrode may be coupled to VDDL. The potential difference between the PODE structure and P-well may create a leakage path which injects leakage current into the P-well. Since the PODE structure and the P-well are both floating, and VDDH is present in the circuit such that the drain electrode of the finFET may be at or near VDDH, leakage current may cause the floating source electrode to increase to a level which surpasses the maximum voltage rating of low voltage devices, resulting in possible high voltage violations to any circuitry coupled to the source electrode of the finFET. Therefore, in one embodiment, any PODE structure adjacent a drain electrode of the finFET is tied to the P-well in order to limit the leakage current and avoid high voltage violations. With these PODE structures tied to the P-well, their voltages track each other, thus limiting any leakage path to the P-well. In this manner, the PODE structure and the P-well are at the same potential, cutting off the leakage path and limiting the potential to which the source electrode can float. Any PODE structure adjacent a source electrode of the finFET may either be tied to the P-well as well or left floating.

FIG. 1 illustrates a top down view of a layout of an integrated circuit (IC) 10 having an n-type finFET 40 (referred to herein as finFET 40). IC 10 is formed on a substrate, which may be a p-type substrate, in which a deep N-well 42 is formed in the substrate. Note that the deep N-well 42 is visible in the illustrated portion of IC 10 in FIG. 1, and the substrate is located under deep N-well 42 and therefore is not visible. Within deep N-well 42 is formed a P-well 12, and n-type finFET 40 is formed in and on P-well 12. In alternate embodiments, fewer or additional wells may be present surrounding P-well 12, depending, for example, on the polarity and type of the substrate. In the illustrated example, finFET 40 includes 3 fins, F1, F2, and F3, running in parallel with each other and with an x-axis of the page. FinFET 40 includes a gate G implemented with two gate conductors, gate conductor 13 and gate conductor 15. The gate conductors run parallel with each other and with a y-axis of the page, and are thus perpendicular to the fins. Under each gate conductor (and therefore not visible in FIG. 1), is a gate dielectric layer. Region 14 of finFET 42 corresponds to the active region or OD region of finFET 42 and extends above and below the top and bottom fin (F1 and F3), and extends until the right and left end of the fins.

FinFET 40 includes PODE structures D1 and D2 (also referred to as end structures or dummy structures) located at the right and left ends of the fins. PODE structure D1 is formed over the left ends of F1-F3, in which a left outer edge of D1 lines up with the left outer edges of the fins and a left outer edge of region 14. PODE structure D2 is formed over the right ends of F1-F3, in which a right outer edge of D2 lines up with the right outer edges of the fins and a right outer edge of region 14. In alternate embodiments, the outer edges of the PODE structures may not line up to the outer edges of the fins and may instead extend past them. The portions of active region 14 between the PODE structures and gate conductors correspond to the source/drain regions (S and Dr) and are heavily doped with n-type implants, resulting in N+ source/drain regions. In the illustrated embodiment, drain region 17 is located between D1 and gate conductor 13, the source region (S) is located between gate conductors 13 and 15, and drain region 19 is located between gate conductor 15 and D2. Drain region 17 and drain region 19 may both together be denoted as the drain (Dr) of finFET 40. Note that finFET 40 can include any number (one or more) of parallel gate conductors for the gate such as gate conductors 13 and 15, and may include any number (one or more) of parallel fins such as F1-F3. Therefore, there may also be any number of source/drain regions, depending on the number of gate conductors used to implement the gate of finFET 40.

FinFET 40 also includes contacts 16, 18, 20, 22, 28, 30, 34, and 36, and local interconnects 24, 26, 32, and 38. Contact 16 connects to D1, contact 18 contacts drain region 17, and interconnect 24 connects contacts 16 and 18. Contact 20 contacts drain region 17, contact 22 contacts P-well 12, and interconnect 26 connects contacts 20 and 22. Therefore, by way of interconnects 24 and 26, D1 is connected (i.e. electrically tied) to P-well 12. Contact 28 contacts drain region 19, contact 30 contacts P-well 12, and interconnect 32 connects contacts 28 and 30. In this manner, the drain of finFET 40 is tied to the body of finFET 40. Contact 34 connects to D2, contact 36 contacts P-well 12, and interconnect 38 connects contacts 34 and 36. Therefore, by way of interconnect 38, D2 is also connected (i.e. electrically tied) to P-well 12. Note that the precise locations, sizes, and shapes of the contacts and interconnects can differ in alternate embodiments, and other combinations of contact and interconnects can be used in order to connect each of D1 and D2 to P-well 12, and, if needed, to connect the body of finFET 40 (P-well 12) to the drain of finFET 40. Those contacts and interconnects illustrated in FIG. 1 only provide examples. Also, further layout features or details have also been left out of FIG. 1 so as not to complicate the drawing.

Note that the option of tying the PODE structures which are adjacent to drain regions of the finFET (e.g. D1 and D2) to a fixed voltage supply rather than the P-well may not provide adequate protection against exposure of the low voltage transistors (i.e. low voltage devices) which exist in a high voltage domain to a voltage which is greater than the maximum voltage rating of the low voltage transistor, leading to long term reliability issues for these low voltage transistors. For example, if these PODE structures were connected instead to ground (such as through a connection to the substrate on which finFET 40 is formed), the potential voltage differential over any two terminals of a low voltage device could reach VDDH-VSS. In the example above in which the low voltage transistors have a maximum voltage rating of 1.8V, the transistors could be exposed to 3.3V-0V (which is 3.3V). Similarly, if these PODE structures were instead tied to the low voltage domain supply such as VDDL, the potential difference could still reach VDDH-VDDL (e.g. 3.3V-1.8V which is 2.2V). Therefore, exposure of low voltage transistors with a maximum voltage rating of only 1.8V to either 3.3V or 2.2V is detrimental to long term reliability of these devices.

Also, note that tying the P-well itself to a fixed voltage supply also results in detrimental consequences. For example, if tied to VSS, then there would be a drain-to-body voltage of 3.3V whenever the drain is at VDDH (e.g. 3.3V), which is a maximum voltage violation for the low voltage transistors (e.g. with a 1.8V maximum voltage rating). If the P-well is tied instead to VDDL (with VDDL=0.8V), then there may be both a maximum voltage violation with the drain-to-body voltage and an undesirable forward bias condition if the well is at VDDL (with VDDL=0.8V) and the source is at VSS. If tied to VDDL (with VDDL=1.8V), then there is no maximum voltage violation but there is still an undesirable strong forward bias condition when the source is at VSS. Therefore, as will be seen in FIG. 2, P-well 12 is not connected to VDDH, VDDL, nor VSS.

Figure 2:
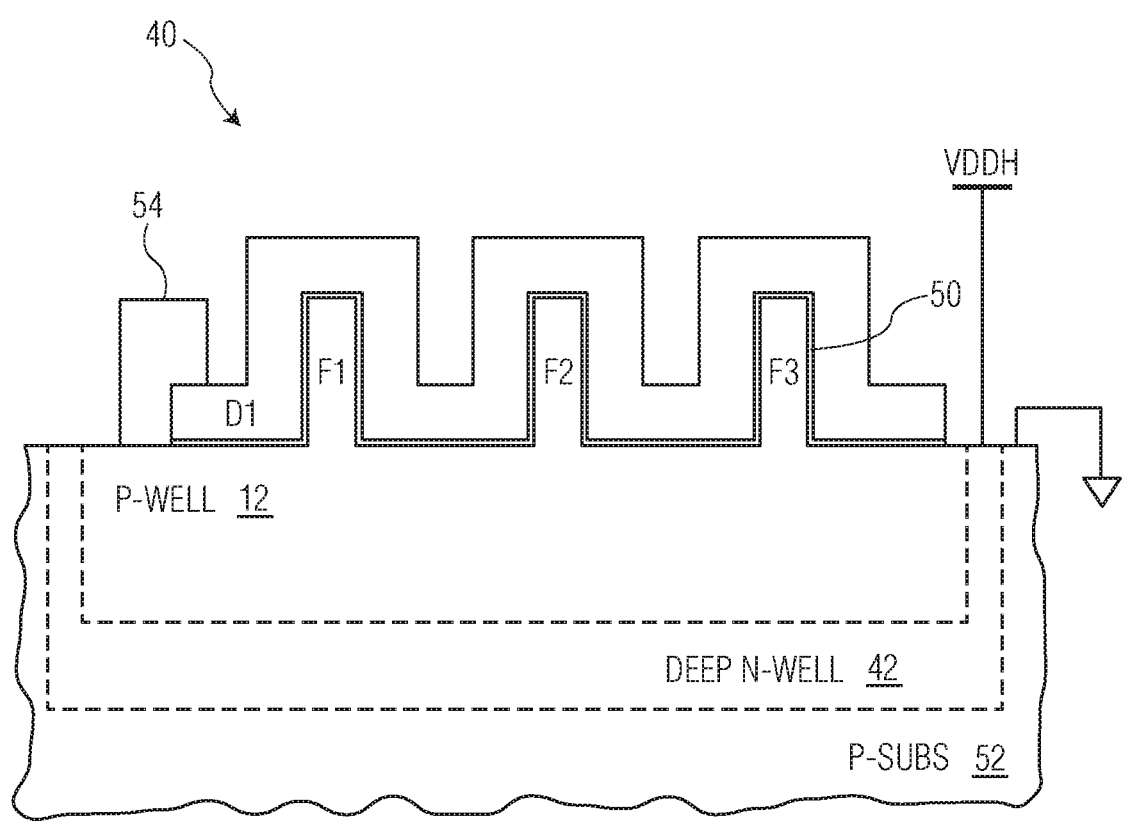
FIG. 2 illustrates a cross-sectional view of the finFET of FIG. 1, in accordance with one embodiment of the present invention.

FIG. 2 illustrates a cross-sectional view of finFET 40 taken at the cut indicated in FIG. 1 through D1 parallel to the y-axis, perpendicular to F1-F3. Therefore, each of fins F1-F3 is visible, as well as a gate dielectric layer 50 underlying D1 and over F1-F3. Note that since D1 is a dummy structure, gate dielectric layer 50 may not be present under D1 and only under the gate conductors. (Note that herein, the VDDH supply terminal, VDDL supply terminal, and VSS supply terminal may be referred to simply as VDDH, VDDL, and VSS, respectively.) As illustrated in FIG. 2, deep N-well 42 is formed in P-substrate 52 and P-well 12 is formed in deep N-well 42. Note that the source/drain regions are not visible as they would be located behind the page in this cross-section. Also illustrated in FIG. 2 is a connection 54 between D1 and P-well 12. Connection 54 represents any combination of contacts and interconnects which are used to tie D1 to P-well 12, such as, for example, contacts 16, 18, 20, and 22 and interconnects 24 and 26 of FIG. 1. In the example of FIG. 2, deep N-well 42 is connected to VDDH and P-substrate 52 (via a, e.g., a substrate electrode) is connected to VSS (e.g. ground). However, P-well 12 is not connected to either VDDH or VSS. As with FIG. 1, the cross-section of FIG. 2 may also include further features or details which have not been included so as not to complicate the drawing. For example, contacts, additional doped regions, interconnects, etc., may also be present as needed.

In the illustrated embodiment of FIG. 1, finFET 40 includes an even number of gate conductors in which D1 and D2 are each immediately adjacent a drain region. D1 and D2 may even overlap part of the adjacent drain regions. In this embodiment, D1 and D2 may each be referred to as a drain PODE structure, or they may collectively be referred to as a drain PODE structure of finFET 40. In another embodiment, regions 17 and 19 may instead be source regions and the region between gate conductors 13 and 15 may be the drain region. In this case, both D1 and D2 would be immediately adjacent source regions, such that neither D1 nor D2 are adjacent a drain region. In this embodiment, D1 and D2 may overlap part of the adjacent source regions and may each be referred to as a source PODE structure (or may collectively be referred to as a source PODE structure of finFET 40).

Figure 6:
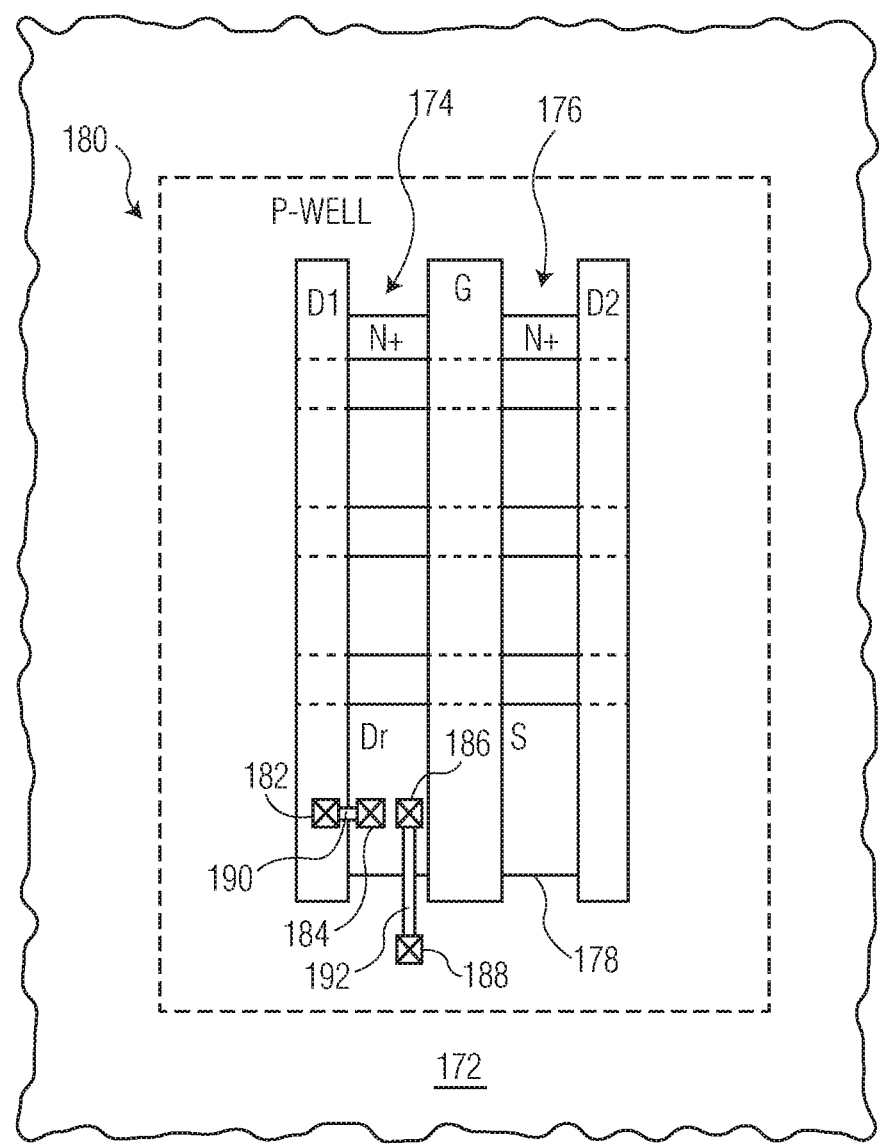
FIG. 6 illustrates a top down view of a finFET transistor layout, in accordance with one embodiment of the present invention

In yet another embodiment, finFET 40 includes an odd number of gate conductors. In this case, one of D1 or D2 would be adjacent a source region of finFET 40 and another one of D1 or D2 would be adjacent a drain region of finFET 40. For example, FIG. 6 illustrates an example of an n-type finFET 180 formed in an integrated circuit 170. The descriptions of active region 178, deep N-well 172, and P-well 194 are analogous to the descriptions of active region 14, deep N-well 42, and P-well 12 in FIG. 1. In FIG. 6, n-type finFET 180 is formed in and on P-well 194. Similar to finFET 40, finFET 180 also includes 3 fins, F1, F2, and F3, and PODE structures D1 and D2. However, finFET 180, unlike finFET 40, implements its gate G using an odd number (e.g. one) gate conductor. An N+ drain region 174 is located between D1 and G, and an N+ source region 176 is located between G and D2. Since there are an odd number of gate conductors, one PODE structure (e.g. D1) is located immediately adjacent the drain region (and may overlap a portion of the drain region) and the other PODE structure (e.g. D2) is located immediately adjacent the source region (and may overlap a portion of the source region). In this embodiment, PODE structure D1 may be referred to as a drain PODE structure and PODE structure D2 as a source PODE structure. Therefore, while each finFET, in general, includes two PODE structures (such as D1 and D2) at or over each end of the active region of the device, both PODE structures can collectively form a drain PODE structure (as D1 and D2 in FIG. 1), collectively form a source PODE structure, or include each of a drain PODE structure and a source PODE structure (such as D1 and D2 in FIG. 6).

Also illustrated in FIG. 6 are contacts 182, 184, 186, and 188, and interconnects 190 and 192. Contact 182 connects to D1, contact 184 connects to drain region 174, and interconnect 190 connects contact 182 to contact 184. Contact 184 connects to drain region 174, contact 188 connects to P-well 194, and interconnect 192 connects contact 186 to contact 188. Therefore, by way of interconnects 190 and 192, D1 is connected (i.e. electrically tied) to P-well 194. Alternate embodiments may connect D1 to P-well 194 in different ways, such as was shown in reference to the connections between D2 and P-well 12 of FIG. 1. In the example of FIG. 6, the source PODE structure, D2, is left floating, but alternatively, can also be electrically tied to P-well 194.

Figure 3:
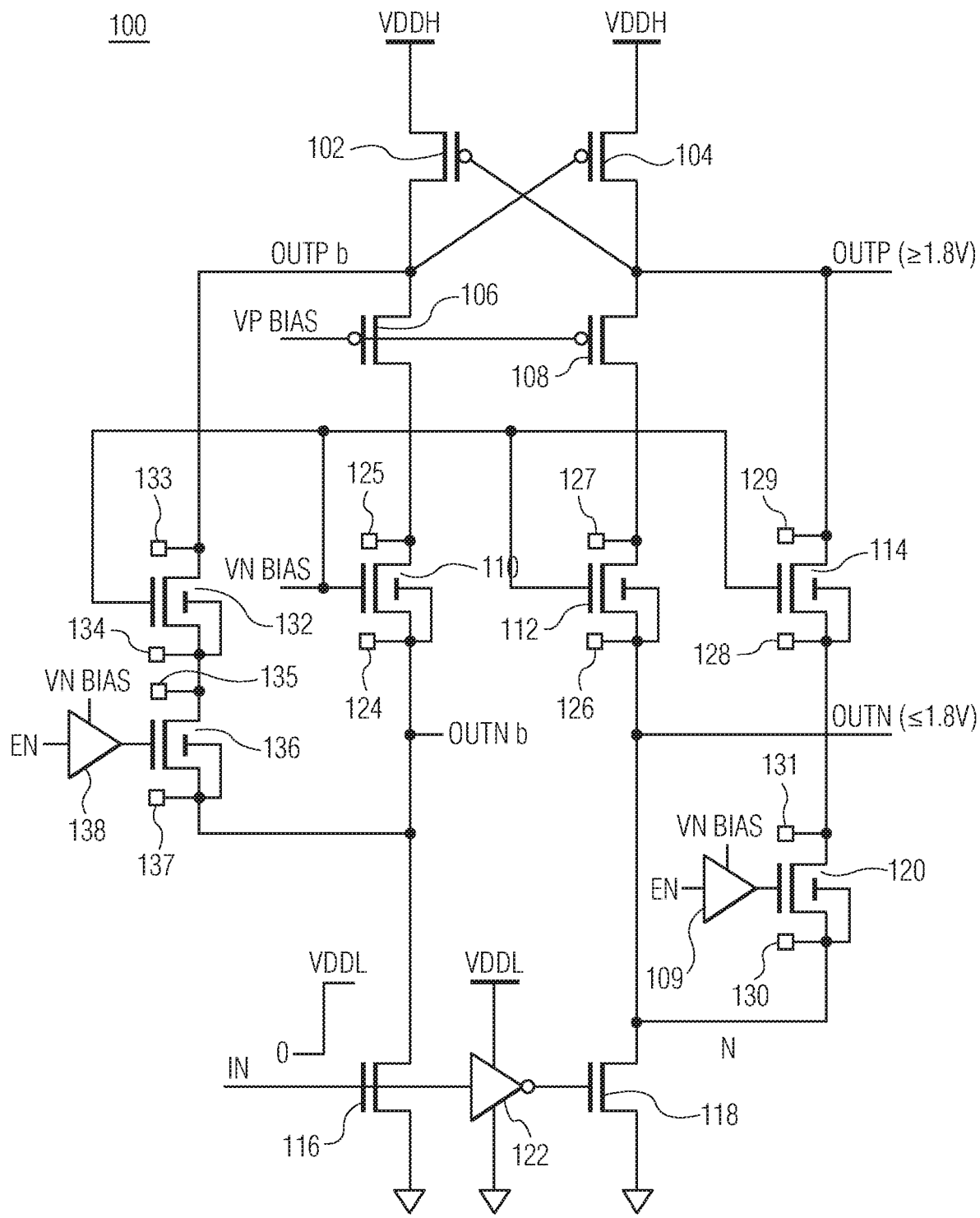
FIG. 3 illustrates, in schematic form, a level shifter interfacing between a high voltage domain and a low voltage domain, in accordance with one embodiment of the present invention.

FIG. 3 illustrates, in schematic form, a level shifter 100 which interfaces between a high voltage domain (supplied by VDDH) and a low voltage domain (supplied by VDDL), in accordance with one embodiment of the present invention. For the illustrated embodiment, it is assumed that VDDH is 3.3V and VDDL is 0.8V, in which the low voltage transistors in level shifter 100 have a maximum voltage rating of 1.8V. Level shifter 100 includes PMOS transistors 102, 104, 106, and 108, and NMOS transistors 110, 112, 114, 116, 118, 120, 132, and 136, an inverter 122, and buffers 138 and 109. First current electrodes (e.g. source electrodes) of transistors 102 and 104 are coupled to VDDH. A second current electrode (e.g. drain electrode) of transistor 104 is coupled to a first current electrode (e.g. source electrode) of transistor 108 and a control electrode of transistor 102, and provides a first output, OUTP, of level shifter 100. A second current electrode (e.g. drain electrode) of transistor 102 is coupled to the first current electrode of transistor 106, a control electrode of transistor 104, and provides a second output OUTPb, in which OUTPb is the inverse of OUTP. A second current electrode (e.g. drain electrode) of transistor 106 is coupled to a first current electrode (e.g. drain electrode) of transistor 110. A second current electrode (e.g. source electrode) of transistor 110 is coupled to a body electrode of transistor 110 and a first current electrode (e.g. drain electrode) of transistor 116. A second current electrode (e.g. source electrode) of transistor 116 is coupled to ground. A second current electrode (e.g. source electrode) of transistor 108 is coupled to a first current electrode (e.g. drain electrode) of transistor 112. A second current electrode (e.g. source electrode) of transistor 112 is coupled to a body electrode of transistor 112 and a first current electrode (e.g. drain electrode) of transistor 118, and provides a third output, OUTN, of level shifter 100. A second current electrode (e.g. source electrode) of transistor 118 is coupled to ground. The second current electrode of transistor 110 also provides a fourth output, OUTNb, which is the inverse of OUTN.

A first current electrode (e.g. drain electrode) of transistor 114 is coupled to the second current electrode (e.g. drain electrode) of transistor 104. A second current electrode (e.g. source electrode) of transistor 114 is coupled to a body electrode of transistor 114 and to a first current electrode (e.g. drain electrode) of transistor 120. A second current electrode (e.g. source electrode) of transistor 120 is coupled to a body electrode of transistor 120 and the first current electrode (e.g. drain electrode) of transistor 118. A first current electrode (e.g. drain electrode) of transistor 132 is coupled to the second current electrode (e.g. drain electrode) of transistor 102. A second current electrode (e.g. source electrode) of transistor 132 is coupled to a body electrode of transistor 132 and to a first current electrode (e.g. drain electrode) of transistor 136. A second current electrode (e.g. source electrode) of transistor 136 is coupled to a body electrode of transistor 136 and the first current electrode (e.g. drain electrode) of transistor 116.

Control gates of transistors 106 and 108 are coupled to receive a first bias voltage, VPBIAS, and control gates of transistors 110, 112, 114, and 132 are coupled to receive a second bias voltage, VNBIAS, in which each of VPBIAS and VNBIAS which may be analog generated references which target the value of VDDM, or 1.8V in this example. Buffers 138 and 109 are coupled to receive a level shift enable signal, EN, which is an active high signal. Buffers 138 and 109 are powered by VNBIAS so as to provide EN at a level of VNBIAS to control gates of transistors 120 and 136. A control electrode of transistor 116 and an input of inverter 122 are coupled to receive an input, IN, of level shifter 100. Inverter 122 has a first power terminal coupled to VDDL and a second power terminal coupled to ground. An output of inverter 122 is coupled to a control electrode of transistor 118.

In one embodiment, all NMOS transistors of level shifter 100 are low voltage transistors and are implemented as n-type finFET transistors having PODE structures as illustrated, for example, in FIG. 1. However, NMOS transistors 116, 118, and those in inverter 122 are not relevant for controlling leakage therefore, any of their corresponding PODE structures are left floating and are not explicitly illustrated in FIG. 3. However, FIG. 3 illustrates two corresponding PODE structures for each of NMOS transistors 110, 112, 114, 120, 132, and 136, illustrated as small squares extending from the drain and source electrodes of each of these NMOS transistors. The illustrated PODE structure extending from the drain electrode of a transistor, and is thus immediately adjacent the drain electrode of the transistor, corresponds to the drain PODE structure, and the illustrated PODE structure extending from the source electrode of a transistor, and is thus immediately adjacent the source electrode of the transistor, corresponds to the source PODE structure. In FIG. 3, a source and drain PODE structure is illustrated for each of NMOS transistors 110, 112, 114, 120, 132, and 136, however, note that in the illustrated embodiment, each of these NMOS transistors is assumed to have at least a drain PODE structure, and may or may not include a source PODE structure, depending on how each finFET is implemented. For example, in the case of an even number of gate conductors, the NMOS transistor may only include a drain PODE structure (such as finFET 40 of FIG. 1), but in the case of an odd number of gate conductors, the NMOS transistor may include both a drain and a source PODE structure (such as finFET 180 of FIG. 6). Also, finFETs of level shifter 100 may be implemented with a same device design (e.g. same number of gate conductors) or with different device designs (e.g. a different number of gate conductors, odd or even).

Referring to the illustrated embodiment of FIG. 3, transistor 110 has a corresponding drain PODE structure 125 and a corresponding source PODE structure 124, and transistor 112 has a corresponding drain PODE structure 127 and a corresponding source PODE structure 126. Transistor 114 has a corresponding drain PODE structure 129 and a corresponding source PODE structure 128, and transistor 120 has a corresponding drain PODE structure 131 and a corresponding source PODE structure 130. Transistor 132 has a corresponding drain PODE structure 133 and a corresponding source PODE structure 134, and transistor 136 has a corresponding drain PODE structure 135 and a corresponding source PODE structure 137. Each of the drain PODE structures (such as D1 and D2 of finFET 40 or D1 of finFET 180) is coupled to the body electrodes of the corresponding transistor, which corresponds to, for example, the P-well in which the n-type finFET is formed (such as P-well 12 for finFET 40 or P-well 194 for finFET 180). Any source PODE structures of FIG. 3 can either also be tied to the P-well as the drain PODE structures are or be left floating.

In operation, when level shifter 100 is enabled to level shift from the low voltage domain to the high voltage domain, a signal at the input, IN, which changes between 0 and VDDL is shifted to produce OUTP which changes between VDDM and VDDH (and is therefore greater than or equal to 1.8V) and OUTN which changes between 0 and VDDM (and is therefore less than or equal to 1.8V. Therefore, a signal at the input, IN, which varies between 0 and VDDL is level shifted to an output signal which varies between 0 and VDDH, in which VDDH can be 3.3V, corresponding to a lower performance mode, or approximately 1.8V (i.e., approximately VNBIAS), corresponding to a higher performance mode.

Transistors 114 and 120 form a bypass path between OUTP and OUTN, and similarly, transistors 132 and 136 form a bypass path between OUTPb and OUTNb. When in the higher performance mode in which VDDH is targeted at approximately 1.8V, EN is asserted which enables the bypass paths by turning on transistors 136 and 120. Therefore, if IN is 0V, transistor 118 is on, as are transistors 120 and 114 of the bypath pass, pulling OUTP and OUTN to 0V, and, by turning on transistor 102, pulling OUTPb and OUTNb to VDDH (1.8V). Similarly, when IN is at VDDL (e.g. 0.8V), transistor 116 is on, as are transistors 136 and 132 of the bypass path, pulling OUTPb and OUTNb to 0V, and, by turning on transistor 104, pulling OUTP and OUTN to VDDH (1.8V). However, when VDDH is instead 3.3V for the lower performance mode, EN is negated, which disables the bypass paths by turning off transistors 136 and 120, in which transistors 102, 104, 106, 108, 110, 112, 116, and 118, and inverter 122, operate as known in the art to provide the level shifting function.

When EN is negated such that transistor 120 is off, the first current electrode (i.e. drain) of transistor 120, as well as the second current electrode (i.e. source) and PODE electrodes 128 and 129, are left floating. Without the connection between drain PODE structure 129 and the underlying P-well, leakage current injected into the P-well could possibly cause the voltage at the second current electrode (i.e. source) of transistor 114 (and thus the first current electrode of transistor 120) to a voltage of greater than VDDL. For example, with the first current electrode (i.e. drain) of transistor 114 at 3.3V (VDDH), and the gate at only 1.8V, the leakage current could cause the voltage at the drain of transistor 120 to actually rise above the maximum voltage rating of transistor 120, which is a low voltage device, destroying the reliability of transistor 120. This could happen because without a connection between the drain PODE structure of transistor 114 and the P-well, there is nothing to limit the increase in this voltage to safe levels. However, since drain PODE structure 129 corresponding to transistor 114 is tied to the underlying P-well by way of the body electrode of transistor 114, as was described in reference to FIG. 1, the leakage current is limited such that the voltage at the second current electrode (i.e. source) of transistor 114 (and the drain of transistor 120) does not go above the maximum voltage rating of transistor 120, thus providing improved device reliability. Note that the same situation applies to transistors 132 and 136 when EN is negated, turning transistor 136 off. Therefore, as with drain PODE structure 129, drain PODE structure 133 is also tied to the underlying P-well by way of the body electrode of transistor 132, as described in reference to FIG. 1, in order to limit the leakage current and prevent the voltage at the drain of transistor 136 from surpassing the maximum voltage rating of transistor 136, which is also a low voltage device.

In the example of FIG. 3, the source PODE structures of transistors 114 and 132 may also be tied to the underlying P-well, P-well 12, or they may be left floating since the sources of the corresponding transistors are not at risk at increasing to damaging voltage levels. Note that, in one embodiment, all of the n-type finFETs in level shifter 100 have their corresponding drain PODE structure coupled to the body terminal of the corresponding finFET so as to limit leakage current when off. In alternate embodiments, this connection may not be present in all n-type finFETs of a circuit. Also, note that alternate embodiments may have different level shifter designs, in which any n-type finFET can have its corresponding drain PODE structures tied to the P-well in which it is formed to limit leakage current and prevent possible high voltage violations.

Figure 4:
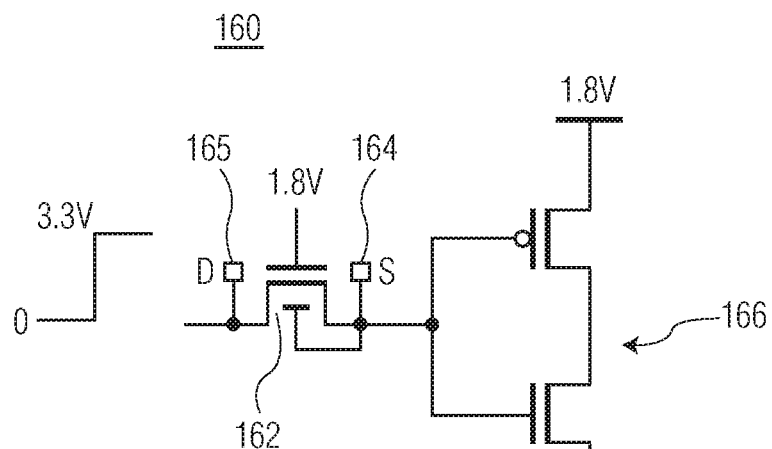
FIG. 4 illustrates, in schematic form, a pass gate interfacing between a high voltage domain and a low voltage domain, in accordance with one embodiment of the present invention.
Figure 5:
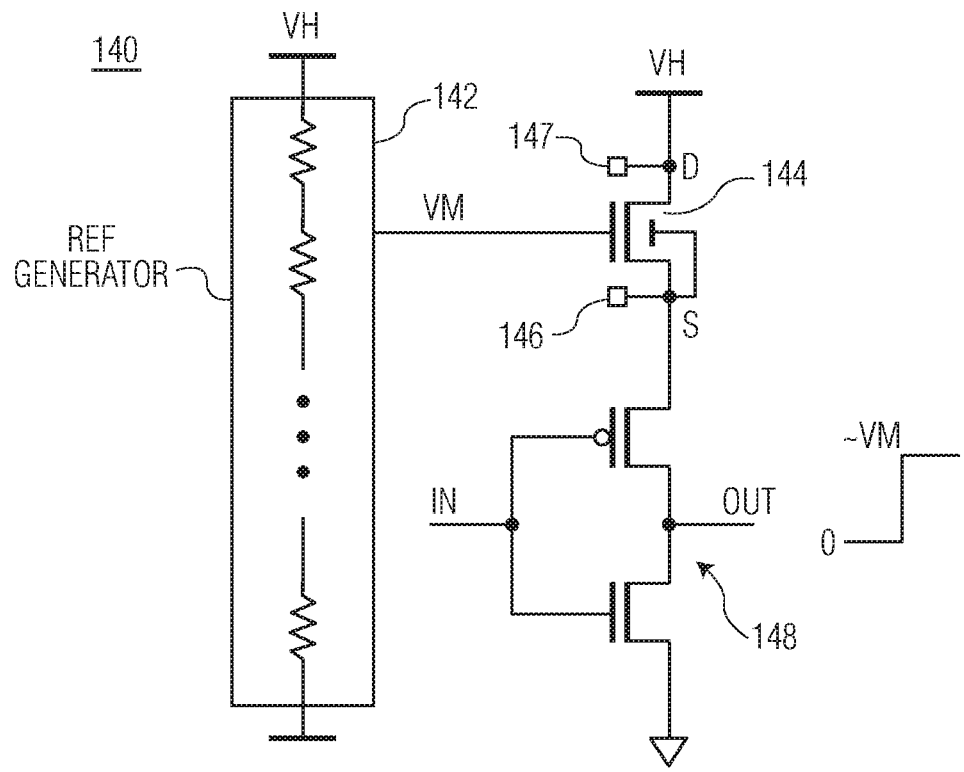
FIG. 5 illustrates, in schematic form, an analog voltage generator interfacing between a high voltage domain and a low voltage domain, in accordance with one embodiment of the present invention.

FIGS. 4 and 5 illustrate, in schematic form, other examples in which it is beneficial to tie the drain PODE structures to the underlying P-well to limit leakage currents to protect low voltage devices in the circuit. FIG. 4 illustrates, in schematic form, a circuit 160 which includes a pass gate 162 and an inverter 166. Circuit 160 operates as a level shifter which transfers signals in a high voltage domain which can vary between 0 and VDDL (e.g. 3.3V) to a low voltage domain (with a supply voltage of VDDL, e.g. 1.8V). Inverter 166 may be considered a low voltage device in which a first power supply terminal is coupled to VDDL (1.8V in this example) and a second power supply terminal is coupled to ground. Inverter 166 is represented with stacked low voltage PMOS and NMOS transistors. A first current electrode of the PMOS transistor corresponds to the first power terminal of inverter 166 and is coupled to 1.8V, and a second current electrode of the PMOS transistor is coupled to a first current electrode of the NMOS transistor. A second current electrode of the NMOS transistor, corresponding to the second power terminal of inverter 166, is coupled to ground. An input of inverter 166 is coupled to the gates of the PMOS and NMOS transistors, and an output is provided from the circuit node at the second current electrode of the PMOS transistor and the first current electrode of the NMOS transistor.

The pass gate is implemented as an n-type finFET (therefore also referred to as finFET 162) with a corresponding drain PODE structure 165 and source PODE structure 164. Assuming finFET 162 were designed like finFET 40 with an even number of gate conductors, drain PODE structure 165 would include both PODE structures D1 and D2 of finFET 162. In this case, there is no source PODE structure. However, depending on the design (e.g. number of gate conductors) of finFET 162, there may also be a corresponding source PODE structure.

A first current electrode (e.g. drain) of transistor 162 is coupled to receive signals from a high voltage domain which vary between 0 and 3.3V, in this example. A control electrode is coupled to 1.8V (which corresponds to VDDL in this example), and a second current electrode (e.g. source) is coupled to an input of an inverter 166 (i.e. to the control electrodes of the PMOS and NMOS transistors of inverter 166). With the control electrode coupled to 1.8V, finFET 162 is always ON (i.e. conductive). The input of the pass gate (at the drain of finFET 162) can reach VDDH (which corresponds to 3.3V in this example). This scenario is similar to the scenario of FIG. 3, in which finFET 162 is analogous to finFET 114, in which the drains of these finFET devices can rise to a high voltage (VDDH) and the tying of the drain PODE structures to the corresponding bodies of the finFETs (and thus to the underlying P-wells of the finFETs) prevents the corresponding sources from reaching voltages detrimental to low voltage devices coupled to these sources. Referring to circuit 160, since drain PODE structure 165 is coupled to the body of transistor 162 (and thus the P-well underlying transistor 162), the leakage current induced by the PODE structures of finFET 162 into the P-well is limited so as to prevent the source of finFET 162 and input of inverter 166 from rising above a maximum voltage rating of the transistors of inverter 166. As in the examples above, the maximum voltage rating may be 1.8 V, and without controlling the leakage current injected into the underlying P-well, the input of inverter 166 could rise to such a level which causes high voltage violations on inverter 166 or any low voltage devices coupled to the second current electrode of transistor 162. Note that if any source PODE structures corresponding to finFET 162 were present, they can also be tied to the underlying P-well.

FIG. 5 illustrates a voltage generator circuit 140 having a reference generator 142, an n-type finFET transistor 144 having a corresponding drain PODE structure 147 and source PODE structure 146, and an inverter 148 which is a low voltage device (represented with stacked low voltage PMOS and NMOS transistors). In the illustrated embodiment, reference generator 142 may be implemented as a resister ladder coupled between a high voltage domain supply voltage, VH, and ground. Circuitry within reference generator 142 selects a node from which to provide a medium supply voltage, VM, which is between VH and ground. VM is coupled to a gate electrode of transistor 144, which has a first current electrode (e.g. drain electrode) coupled to VH and a second current electrode (e.g. source electrode) coupled to a first power terminal of inverter 148 (corresponding to a first current electrode of the PMOS transistor). A second current electrode of the PMOS transistor is coupled to a first current electrode of the NMOS transistor, and a second current electrode, corresponding to a second power terminal of inverter 148, is coupled to ground. An input of inverter 148 is coupled to the gates of the PMOS and NMOS transistors, and an output is provided from the circuit node at the second current electrode of the PMOS transistor and the first current electrode of the NMOS transistor.

Assuming a finFET like finFET 40 is used for finFET 144, drain PODE structure 147 includes the PODE structures D1 and D2 of transistor 144. In this example, there would be no source PODE structure. Drain PODE structure 147 is coupled to the P-well underlying transistor 144 through connection to the body terminal of transistor 144. This can be done in any of the ways discussed above with respect to FIG. 1. Transistor 144 is configured as a source-follower which provides a supply voltage of approximately VM to any device coupled to the second current electrode (source electrode) of transistor 144. In the illustrated example, when transistor 144 is on, the source electrode of transistor 144 provides the approximate VM voltage to power inverter 148, in which the input and output of inverter 148 vary between 0 and approximately VM. Inverter 148 is a low voltage device, in which a voltage greater than VM should not be used to supply the inverter. Therefore, by tying drain PODE structure 147 to the underlying P-well, leakage current is limited when transistor 144 is off so as to prevent the voltage at the source of transistor 144 from rising above VM, thus protecting the transistors of inverter 148, or any low voltage devices or transistors coupled to the source of transistor 144. Note that if any source PODE structures corresponding to finFET 144 were present, they can also be tied to the underlying P-well.

Each of level shifter 100, circuit 160, and voltage generator circuit 140 of FIGS. 3-5, respectively, include multiple voltage supply terminals (e.g. VDDH, VDDL, Ground, VH, etc.) and a current path which is electrically coupled to the lowest voltage supply terminal (e.g. Ground), where an N-type finFET transistor (having either on odd or even number of gate conductors) is located in the current path, wherein at least one PODE structure of the finFET transistor is electrically tied the underlying well region and in which the underlying well region is not electrically tied to the lowest voltage supply terminal. For example, level shifter 100 includes a current path through transistors 114, 120, and 118 to ground, in which the drain PODE structures of transistors 114 and 120 are tied to the P-well underlying the devices but the P-well is not electrically connected to ground. As another example, circuit 160 includes a current path through transistors 162 and the NMOS transistor of the inverter to ground, in which the drain PODE structure of transistor 162 is tied to the underlying P-well, and the P-well is not electrically connected to ground. Also, in voltage generator circuit 140 includes a current path through transistor 144, in which the drain PODE structure of transistor 144 is tied to the underlying P-well, and the P-well is not electrically connected to ground. In each of these examples, by electrically tying the drain PODE structures in the current paths to the underlying P-well, the voltage differential between the drain PODE structure and the P-well is limited, regardless of the voltage on the drain. This cuts off the leakage path between the drain PODE structure and the P-well, thus limiting the potential to which the source electrode can float.

Therefore, by now it can be appreciated that, when using an n-type finFET having PODE structures, leakage current can be limited by tying the PODE structures, such as the drain PODE structure, to the underlying P-well in which the finFET is formed. In circuits which interface between high and low voltage domains, it is possible, when the finFET is off, to create a leakage path between the PODE structures and the P-well which can raise the voltage at the source electrode of the finFET to levels which cause high voltage violations to low voltage devices coupled to the source electrode of the finFET. Therefore, tying at least the drain PODE structures to the P-well (and therefore the body of the finFET), the differential between the drain PODE structures and P-well is controlled, thus limiting the leakage path so as to prevent the source electrode from increasing to damaging levels. This allows for improved reliability of devices in the low voltage domain, even when interfacing with high voltage domains.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the PODE structures described above correspond to n-type finFET devices, skilled artisans appreciate that conductivity types and polarities of potentials may be reversed with respect to other circuit devices and elements.

Moreover, the terms "front," "back," "top," "bottom," "over," "under", "right", "left" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the n-type finFETs with PODE structures tied as discussed in the examples above can be used in other types of circuits other than those discussed in reference to FIGS. 3-5. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a circuit includes a plurality of voltage supply terminals including a lowest voltage supply terminal; an N-type finFET transistor including at least one semiconductor fin, a gate structure made of a gate material located over the at least one fin, and an end structure of the gate material located over an end of the at least one fin, the at least one fin located over a well region, the finFET including a source electrode and a drain electrode, the end structure electrically tied to the well region; and a current path electrically coupled to the lowest voltage supply terminal, where the N-type finFET transistor is located in the current path, wherein the well region is not electrically tied to the lowest voltage supply terminal. In one aspect, the drain electrode include a drain region in the at least one fin that is laterally adjacent to the end of the at least one fin such that no source region is located between the end and the drain region. In another aspect, the circuit includes a level shifter circuit, the level shifter circuit including the N-type finFET. In a further aspect, the level shifter circuit translates a signal between two voltage domains wherein the lowest voltage supply terminal is a lower voltage supply terminal of a lower voltage domain of the two voltage domains. In even a further aspect, the drain electrode is electrically is coupled to an output of a higher voltage domain of the two voltage domains. In another further aspect, the N-type finFET transistor is located in a current path for selectively coupling an output of a higher voltage domain of the two voltage domains to an output of the lower voltage domain. In yet another further aspect, the circuit further includes a high voltage supply terminal that is a higher voltage supply terminal of the higher voltage domain of the two voltage domains, the current path being electrically coupled to the high voltage supply terminal. In another aspect, the circuit further includes a high voltage supply terminal where a voltage difference between the lowest voltage supply terminal and the high voltage supply terminal is greater than a maximum voltage rating of a transistor coupled to the source electrode of the N-type finFET. In yet another aspect, the circuit further includes a high voltage supply terminal where a voltage difference between the lowest voltage supply terminal and the high voltage supply terminal is greater than a maximum voltage rating of a transistor located in the current path between the N-type finFET and the lowest voltage supply terminal. In yet another aspect, the N-Type finFET is implemented in a circuit in providing a reference voltage between a voltage of the lowest voltage supply terminal and a voltage of a high voltage supply terminal of the circuit. In a further aspect, the end structure is electrically tied to a node providing the reference voltage. In yet another aspect, the N-type finFET is implemented as a source follower. In another aspect, the end structure is electrically tied to the well region through the end structure being electrically tied to the source electrode and the source electrode being electrically tied to the well region. In another aspect, the circuit further includes a substrate electrode of a substrate, the substrate electrode electrically tied to the lowest voltage supply terminal. In a further aspect, the circuit further includes an N-type well physically separating the well region from the substrate, wherein the well region has a P-type doping and the substrate has P-type doping. In another aspect, the well region is electrically tied to the input of an inverter. In yet another aspect, the well region is electrically tied to the source electrode. In yet another aspect, the end structure includes a portion that runs generally parallel over the at least one fin to a portion of the gate structure.

In another embodiment, a circuit includes a plurality of voltage supply terminals including a lowest voltage supply terminal and a high voltage supply terminal; an N-type finFET transistor including at least one semiconductor fin, a gate structure made of a gate material located over the at least one fin, and an end structure of the gate material located over an end of the at least one fin, the at least one fin located over a well region, the finFET including a source electrode and a drain electrode, the end structure electrically tied to the well region; a current path electrically coupled to the lowest voltage supply terminal, where the N-type finFET transistor is located in the current path, wherein the well region is not electrically tied to the lowest voltage supply terminal; and a second transistor coupled to the source electrode of the N-type finFET, where a voltage difference between the lowest voltage supply terminal and the high voltage supply terminal is greater than a maximum voltage rating of the second transistor. In one aspect, the second transistor is located in the current path between the N-type finFET and the lowest supply voltage terminal.

What is claimed is:

1. A circuit comprising:
    a plurality of voltage supply terminals including a lowest voltage supply terminal;
    an N-type finFET transistor including at least one semiconductor fin, a gate structure made of a gate material located over the at least one fin, and an end structure of the gate material located over an end of the at least one fin, the at least one fin located over a well region, the finFET including a source electrode and a drain electrode, the end structure electrically tied to the well region;
    a current path electrically coupled to the lowest voltage supply terminal, where the N-type finFET transistor is located in the current path, wherein the well region is not electrically tied to the lowest voltage supply terminal.

2. The circuit of claim 1 wherein the drain electrode include a drain region in the at least one fin that is laterally adjacent to the end of the at least one fin such that no source region is located between the end and the drain region.

3. The circuit of claim 1 wherein the circuit includes a level shifter circuit, the level shifter circuit including the N-type finFET.

4. The circuit claim 3 wherein the level shifter circuit translates a signal between two voltage domains wherein the lowest voltage supply terminal is a lower voltage supply terminal of a lower voltage domain of the two voltage domains.

5. The circuit of claim 4 wherein the drain electrode electrically is coupled to an output of a higher voltage domain of the two voltage domains.

6. The circuit of claim 4 wherein the N-type finFET transistor is located in a current path for selectively coupling an output of a higher voltage domain of the two voltage domains to an output of the lower voltage domain.

7. The circuit of claim 4 wherein the circuit further includes a high voltage supply terminal that is a higher voltage supply terminal of the higher voltage domain of the two voltage domains, the current path being electrically coupled to the high voltage supply terminal.

8. The circuit of claim 1 wherein the circuit further includes a high voltage supply terminal where a voltage difference between the lowest voltage supply terminal and the high voltage supply terminal is greater than a maximum voltage rating of a transistor coupled to the source electrode of the N-type finFET.

9. The circuit of claim 1 wherein the circuit further includes a high voltage supply terminal where a voltage difference between the lowest voltage supply terminal and the high voltage supply terminal is greater than a maximum voltage rating of a transistor located in the current path between the N-type finFET and the lowest voltage supply terminal.

10. The circuit of claim 1 wherein the N-Type finFET is implemented in a circuit in providing a reference voltage between a voltage of the lowest voltage supply terminal and a voltage of a high voltage supply terminal of the circuit.

11. The circuit of claim 10 wherein the end structure is electrically tied to a node providing the reference voltage.

12. The circuit of claim 1 wherein the N-type finFET is implemented as a source follower.

13. The circuit of claim 1 wherein the end structure is electrically tied to the well region through the end structure being electrically tied to the source electrode and the source electrode being electrically tied to the well region.

14. The circuit of claim 1 further including a substrate electrode of a substrate, the substrate electrode electrically tied to the lowest voltage supply terminal.

15. The circuit of claim 14 further comprising an N-type well physically separating the well region from the substrate, wherein the well region has a P-type doping and the substrate has P-type doping.

16. The circuit of claim 1 wherein the well region is electrically tied to the input of an inverter.

17. The circuit of claim 1 wherein the well region is electrically tied to the source electrode.

18. The circuit of claim 1 wherein the end structure includes a portion that runs generally parallel over the at least one fin to a portion of the gate structure.

19. A circuit comprising:
- a plurality of voltage supply terminals including a lowest voltage supply terminal and a high voltage supply terminal;
- an N-type finFET transistor including at least one semiconductor fin, a gate structure made of a gate material located over the at least one fin, and an end structure of the gate material located over an end of the at least one fin, the at least one fin located over a well region, the finFET including a source electrode and a drain electrode, the end structure electrically tied to the well region;
- a current path electrically coupled to the lowest voltage supply terminal, where the N-type finFET transistor is located in the current path, wherein the well region is not electrically tied to the lowest voltage supply terminal;
- a second transistor coupled to the source electrode of the N-type finFET, where a voltage difference between the lowest voltage supply terminal and the high voltage supply terminal is greater than a maximum voltage rating of the second transistor.

20. The circuit of claim 19, wherein the second transistor is located in the current path between the N-type finFET and the lowest supply voltage terminal.

* * * * *